(12) United States Patent
Bae

(10) Patent No.: US 6,300,174 B1
(45) Date of Patent: Oct. 9, 2001

(54) LIQUID CRYSTAL PANEL HAVING A THIN FILM TRANSISTOR FOR DRIVER CIRCUIT AND A METHOD FOR FABRICATING THEREOF

(75) Inventor: Sung-Sik Bae, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/334,942

(22) Filed: Jun. 17, 1999

Related U.S. Application Data

(62) Division of application No. 08/833,496, filed on Apr. 7, 1997, now Pat. No. 5,969,702.

(30) Foreign Application Priority Data

May 11, 1996 (KR) ................................................. 96-15698

(51) Int. Cl.⁷ .................................................. H01L 21/00
(52) U.S. Cl. .......................... 438/151; 438/152; 438/166; 438/308
(58) Field of Search .................................... 438/151, 152, 438/166, 308, 231, 286; 257/59, 72, 350, 347, 296

(56) References Cited

U.S. PATENT DOCUMENTS

| | | | |
|---|---|---|---|
| 5,317,433 | 5/1994 | Miyawaki et al. ..................... | 349/45 |
| 5,346,833 | 9/1994 | Wu ....................................... | 438/30 |
| 5,419,991 | 5/1995 | Segawa .................................. | 430/20 |
| 5,432,625 | 7/1995 | Morin et al. ............................ | 349/42 |
| 5,541,748 | 7/1996 | Ono et al. .............................. | 349/42 |
| 5,666,177 | 9/1997 | Hsieh et al. ........................... | 349/111 |
| 5,703,668 | 12/1997 | Shin ...................................... | 349/110 |
| 5,712,494 | 1/1998 | Akiyama et al. ....................... | 257/59 |
| 5,718,992 | 2/1998 | Sato et al. ............................. | 349/110 |
| 5,781,254 | 7/1998 | Kim et al. .............................. | 349/44 |
| 5,784,133 | 7/1998 | Kim et al. .............................. | 349/44 |
| 5,789,762 | * 8/1998 | Koyama et al. ....................... | 257/66 |
| 5,814,529 | 9/1998 | Zhang .................................... | 438/30 |
| 5,844,255 | 12/1998 | Suzuki et al. ......................... | 257/59 |
| 5,877,514 | * 3/1999 | Seo ........................................ | 257/72 |
| 5,969,702 | * 10/1999 | Bae ....................................... | 345/92 |
| 6,023,074 | * 2/2000 | Zhang .................................... | 257/59 |
| 6,087,730 | * 7/2000 | McGarvey et al. ..................... | 257/66 |
| 6,133,073 | * 10/2000 | Yamazaki et al. .................... | 438/151 |
| 6,133,075 | * 10/2000 | Yamazaki et al. .................... | 438/158 |
| 6,146,928 | * 11/2000 | Ishiguro et al. ...................... | 438/151 |
| 6,147,667 | * 11/2000 | Yamazaki et al. .................... | 257/57 |
| 6,175,395 | * 1/2001 | Yamazaki et al. .................... | 394/44 |

* cited by examiner

Primary Examiner—Michael S. Lebentritt
(74) Attorney, Agent, or Firm—Finnegan, Henderson, Farabow, Garrett & Dunner, L.L.P.

(57) ABSTRACT

A method of fabricating a liquid crystal panel comprises the steps of forming a black matrix on a substrate, forming a buffer layer on the substrate, forming semiconductors layer on the buffer layer, doping n⁺ impurities into a semiconductor layer on a pixel region on the substrate and in one semiconductor layer of the driver circuit region forming a gate insulating layer on the buffer layer and the semiconductor layer, forming a gate electrode on the gate electrode, introducing n⁻ impurities into the semiconductor layer using the gate electrode as a mask after patterning of the gate insulating layer, doping p⁺ impurities into another semiconductor layer of the driver circuit unit, forming an insulating layer having a contact hole over the pixel region, forming a transparent electrode on the pixel region and into the contact hole.

38 Claims, 6 Drawing Sheets

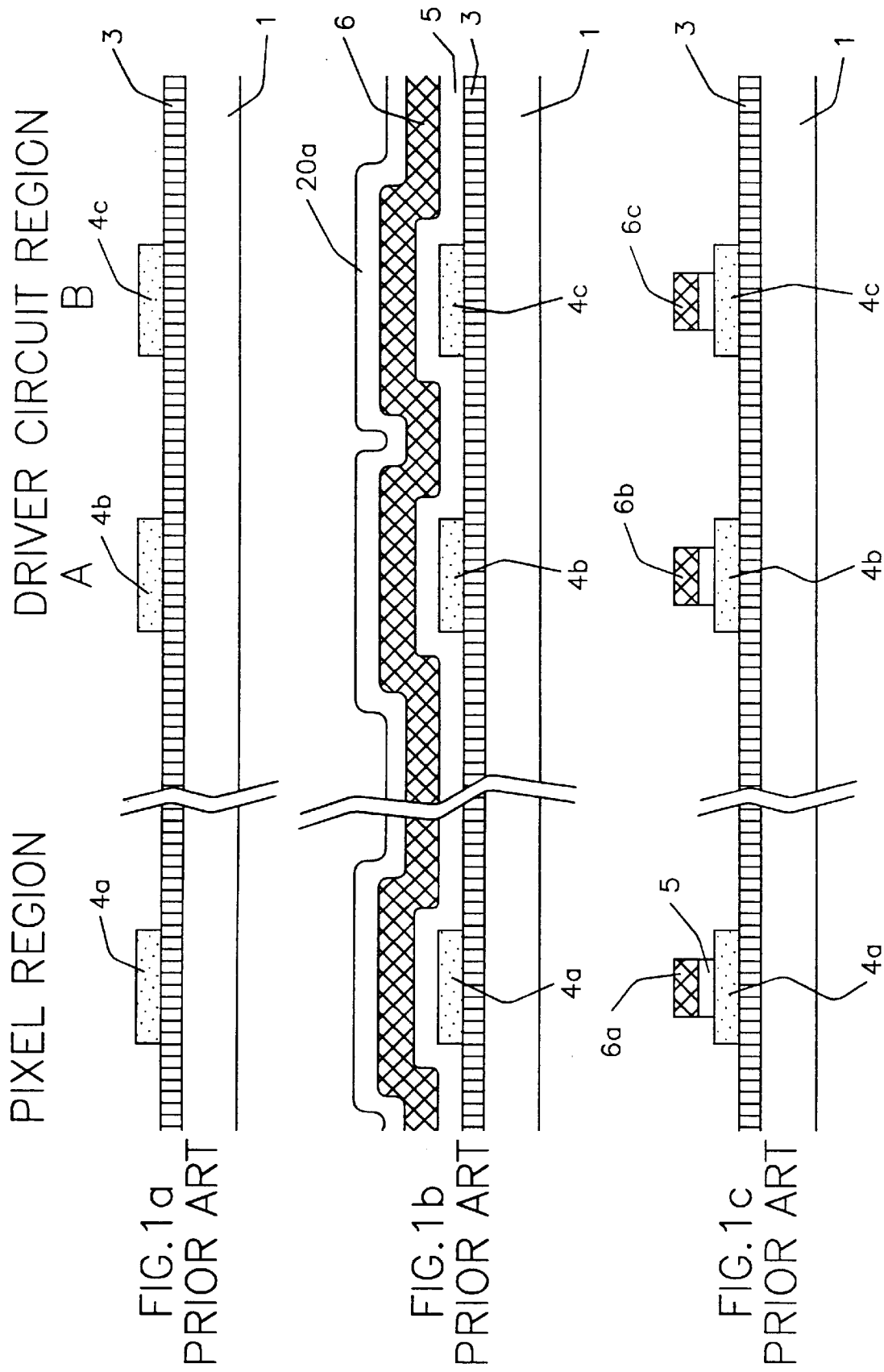

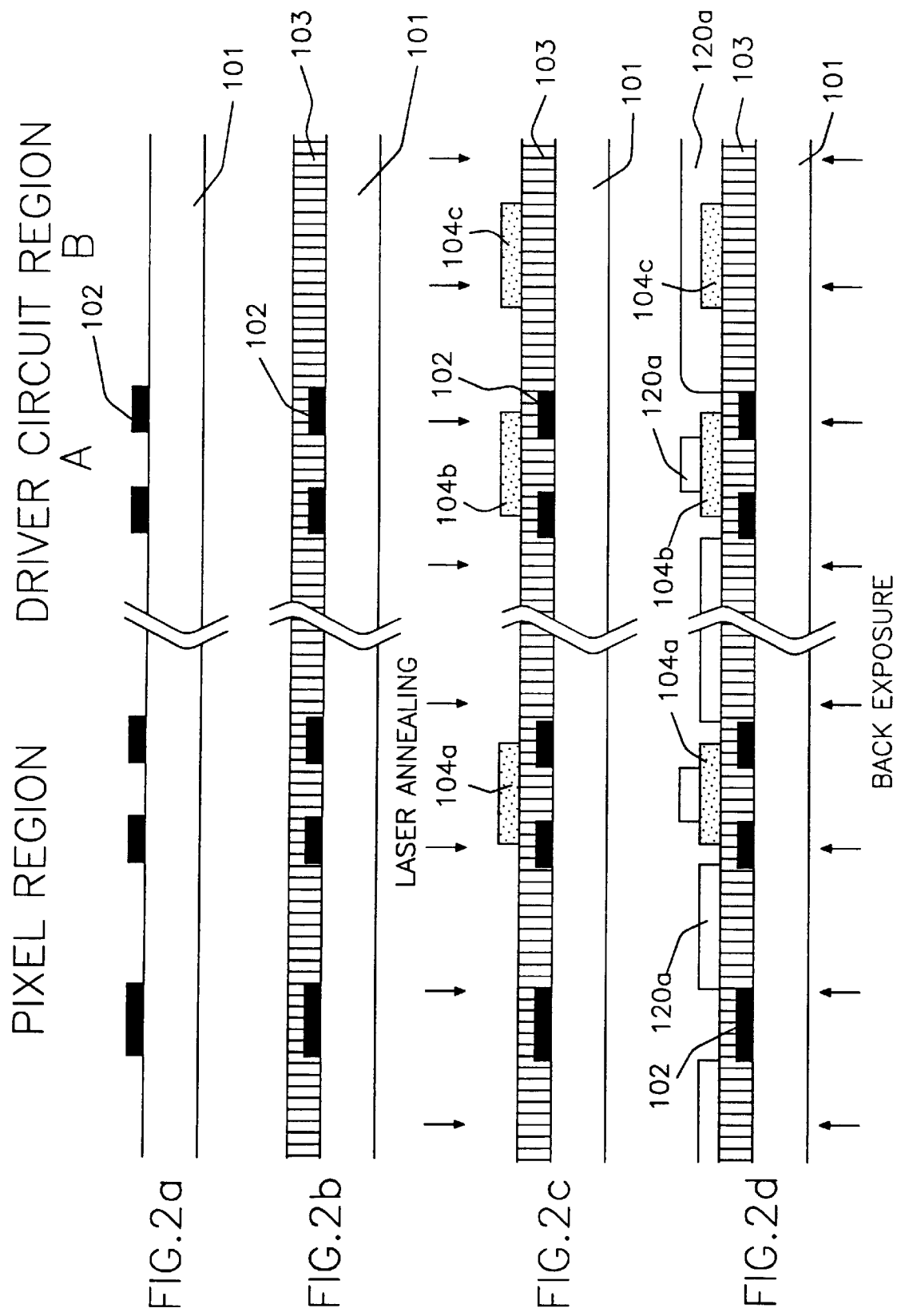

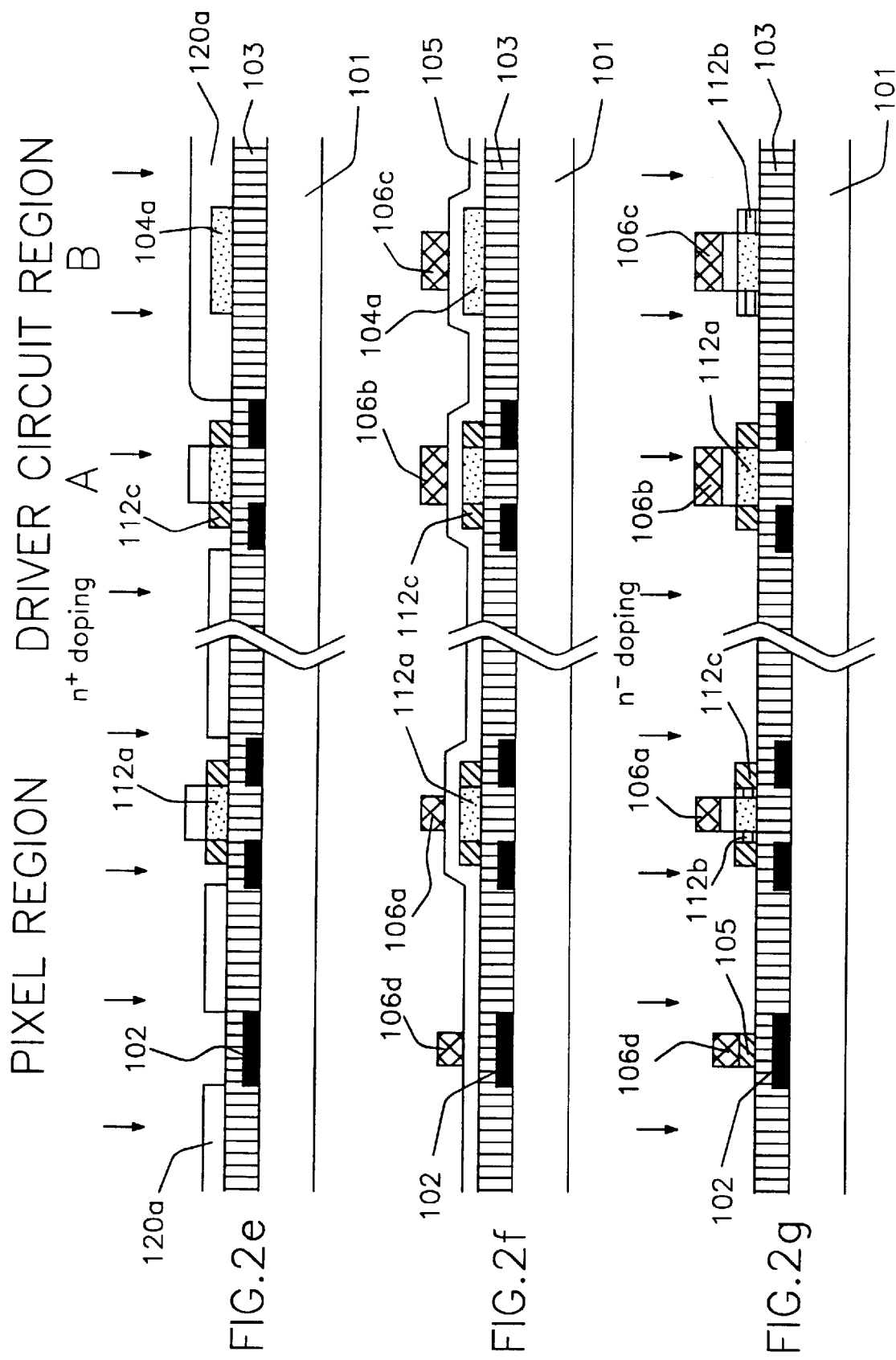

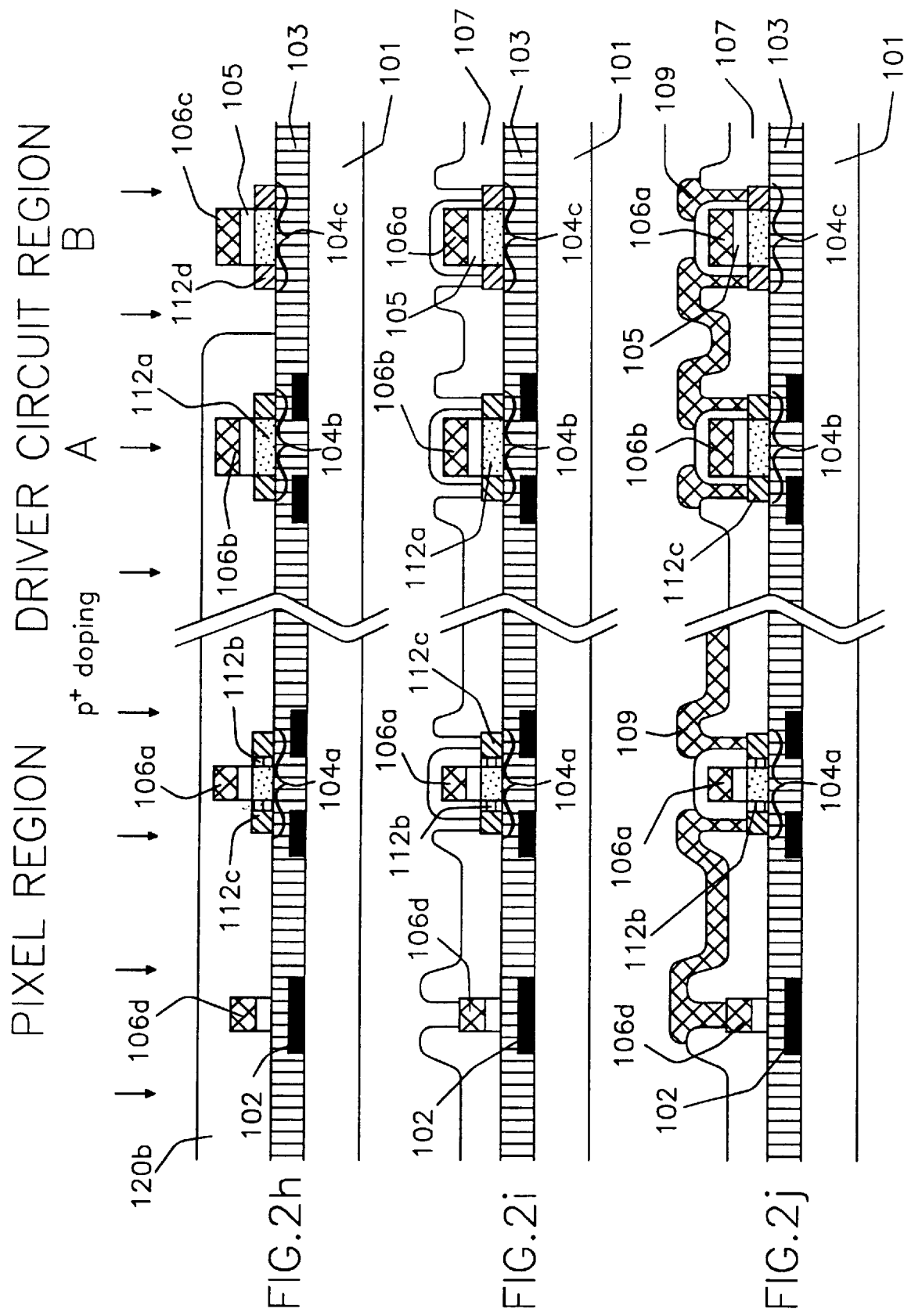

LIQUID CRYSTAL PANEL HAVING A THIN FILM TRANSISTOR FOR DRIVER CIRCUIT AND A METHOD FOR FABRICATING THEREOF

This is a division of application Ser. No. 08/833,496, filed Apr. 7, 1997 which is hereby incorporated by reference and is now U.S. Pat. No. 5,969,702.

BACKGROUND OF THE INVENTION

The present invention relates to a liquid crystal panel and related method, and more particularly to a liquid crystal panel in which a thin film pixel driving transistors and thin film driver circuit transistors are integrated on a panel in a single process.

Large area and high resolution active matrix liquid crystal displays (AMLCD) include thin film transistors (TFTs) for driving individual pixels of the display pixels. TFTs are also incorporated into driver circuits for applying signals to gate bus lines and data bus lines coupled to the pixel driving TFTs of the display.

Generally, the driver circuit unit can be an integrated circuit attached to an outer portion of the substrate of the liquid crystal panel, and the driver circuit TFTs formed on the liquid crystal panel. Typically, the complementary metal oxide semiconductor TFTs (CMOS TFTs) with high field effect mobility are used in the driver circuits attached to the liquid crystal panel. Since this type of CMOS TFT consists of polysilicon (p-Si), the switching speed is much higher than that of amorphous silicon (a-Si). Further, because the driver circuit TFT and the pixel driving TFT are fabricated at the same time, the fabrication cost can be decreased.

FIGS. 1a–1h illustrate various steps of the conventional method of fabricating a typical liquid crystal panel including TFT driver circuits. For illustrative purposes in FIGS. 1a–1h, the driver circuit unit is shown divided into parts A and B.

As shown in FIG. 1a, a buffer layer 3 is first formed on the substrate 1 and then patterned a-Si semiconductor layers 4a, 4b and 4c are formed on the pixel and driver circuit portions. Semiconductor layer 4a corresponds to a transistor driving a single pixel and semiconductor layers 4b and 4c represent NMOS and PMOS TFTs formed on the driver circuit region.

As shown in FIG. 1b, an insulating layer 5 such as $SiO_2$ and SiNx, a metal layer 6 such as Al, Al alloy, and Cr, and a photoresist 20a are successively formed on buffer layer 3. The insulating layer 5 and the metal layer 6 are patterned by a photolithography process to form gate insulating layer 5 and gate electrodes 6a, 6b, 6c. Low concentration $n^-$ ions are introduced into the entire area of the substrate 1, as shown in FIG. 1d, using gate electrodes 6a, 6b, 6c as masks over semiconductor layers 4a, 4b, 4c. As a result, portions of semiconductor layers 4a, 4b, 4c except those regions covered by gate electrodes 4a, 4b, 4c become doped $n^-$ layers 12b, and the regions under gate electrodes 4a, 4b, 4c become channel layers 12a.

Thereafter, photoresist layer 20b is deposited over substrate 1 and patterned to shield part B of the driver circuit region; gate electrode 6a, part of the activation layer, and an $n^-$ layer of the pixel region. As shown in FIG. 1e, $n^+$ ions are introduced into the entire surface of substrate 1. In the pixel region, the width of photoresist 20b is larger than that of the gate electrode. Accordingly, the $n^+$ ions are implanted into a part of the $n^-$ layer 12b. As a result, $n^+$ layer 12c is formed in semiconductor layers 4a and 4b of the pixel region and part A of the driver circuit region. Further, the resulting transistor in the pixel region has an LDD structure including $n^+$ layer 12c and $n^-$ layer 12b.

After photoresist 20b is removed, another photoresist layer 20c is deposited and patterned to shield the pixel region and part A of the driver circuit, as shown in FIG. 1f. $P^+$ ions are then implanted into substrate 1, and $p^+$ region 12d are thus formed in part B of the driver circuit. Regions 12d are doped with both $p^+$ and $n^-$ ions, and are thus counter doped. Since the $n^-$ ion concentration is approximately $10^{16}\sim10^{18}/cm^3$ and the $p^+$ doping is about $10^{19}\sim10^{21}/cm^3$, the $n^-$ layer 12b is converted into $p^+$ layer 12d. Photoresist layer 20c is then removed.

Thus, the pixel region has TFTs with an LDD structure, including $n^+$ layer 12a and $n^-$ layer 12b, and the driver circuit has NMOS TFTs having $n^+$ layer 12c and PMOS TFTs including $p^+$ layers 12d.

A contact hole is next formed in patterned SiNx insulation layer 7, as shown in FIG. 1g. A metal, such as Al, is then deposited on insulating layer 7 and into the contact hole to form source/drain electrode 8. Further, indium tin oxide (ITO) is deposited on the insulating layer 7 and source/drain electrode 8 to form a transparent pixel electrode 9 as shown in FIG. 1h. A passivation layer 10 is then provided blanketing the entire surface. In the liquid crystal panel fabricated according to the above described process, the pixel region has TFTs with an LDD structure and the driver circuit unit includes CMOS TFTs.

Although not shown in the figures, passivation layer 10 is patterned to form pad openings to interconnect the driver circuit region with an outer driver circuit attached to an outer portion of the substrate of the liquid crystal panel. Further, an alignment layer is formed on the passivation layer and rubbed mechanically to provide an alignment direction for the liquid crystal material. Further, another substrate is provided facing the above-described substrate, having color filters and a black matrix formed thereon to prevent light leakage.

In the above mentioned process, ten masks are used for patterning: the semiconductor layer, the $n^+$ implant mask, the gate insulating layer and gate electrodes, the $p^+$ implant mask, the contact hole, the source/drain electrodes, the transparent electrode, passivation layer pad openings, and black matrix. The conventional process, therefore, is complicated, the yield is reduced, and the fabrication cost is increased.

SUMMARY OF THE INVENTION

An object of the present invention is to provide a liquid crystal panel having a thin film transistor driver circuit and a related manufacturing method in which the black matrix, pixel unit, and a driver circuit unit are fabricated on one panel, so that the fabrication cost can be decreased and the aperture ratio can be improved.

In order to achieve this object, the present invention provides a method comprising the steps of forming the black matrix on a substrate, forming a buffer layer over the substrate, forming semiconductor layers on the buffer layer, doping $n^+$ ions into the semiconductor layers using a patterned photoresist layer to mask one of the semiconductor layers and a portion of one of the other semiconductor layers of the driver circuit region, and a portion of the semiconductor layer of the pixel region, thus selectively forming $n^+$ layers in the semiconductor layer of the pixel region and in the driver circuit region.

The method further comprises the steps of: forming a patterned gate insulating layer on the buffer layer and the semiconductor layer, forming a gate electrode on the gate insulating layer, introducing n⁻ ions into the semiconductor layer using the gate electrode as a mask, introducing p⁺ ions into the semiconductor layer using a photoresist layer as a mask covering the pixel region and selected ones of the layers of the driver circuit region implanted with n⁺ ions to form the p⁺ layer in other semiconductor layers of the driver circuit, forming an insulating layer having a contact hole, forming a transparent electrode on the insulating layer of the pixel region and into the contact hole.

Since the width of the gate electrode in the pixel region is narrower than that of the gate electrode in the driver circuit region, the n⁻ layer is formed between the n⁺ layer and the channel region of the semiconductor layer of the pixel region. Accordingly, the pixel region includes thin film transistors having lightly doped drain structures comprising an n⁺ layer, an n⁻ layer, and the channel region.

The semiconductor layers are typically made of polysilicon formed by laser annealing of amorphous silicon.

The fabrication process in accordance with the present invention requires only six masks for: patterning the black matrix, patterning the semiconductor layer, patterning photoresist layer masks for doping the p⁺ ions, forming the contact hole, and forming the transparent electrode.

BRIEF DESCRIPTION OF THE DRAWINGS

FIGS. 1a–1h illustrate the steps of a conventional method for fabricating a typical liquid crystal panel.

FIGS. 2a–2j illustrate a process according to the present invention for forming pixel driving TFT portions (i.e., the pixel region) and driver circuit CMOS TFT portions (i.e., the driver circuit region) formed on substrate 101. Further, the driver circuit region is divided into parts A and B corresponding to NMOS TFT and PMOS TFT regions, respectively.

As seen in FIG. 2a, a substantially opaque layer preferably including black resin is formed on substrate 101 by depositing black resin or the like on the surface of substrate 101. The layer is then patterned to form black matrix 102, which prevent light leakage outside the pixel areas. Black matrix 102 is preferably formed in regions corresponding to the TFT, gate bus line, and data bus line. Preferably, black matrix 102 overlaps an edge of the pixel.

As shown in FIG. 2b, a buffer layer 103 preferably including $SiO_2$ is formed on substrate 101 and black matrix 102, and as shown in FIG. 2c, an a-Si layer is formed on buffer layer 103, which is annealed through a single exposure to laser light emitted from an eximer laser. As a result, the a-Si is crystallized and converted into the polysilicon (p-Si). The p-Si layer is then patterned to form spaced p-Si semiconductor layers 104a, 104b, 104c on buffer layer 103, as shown in FIG. 2c.

Figures 1D, 1E, 1F:
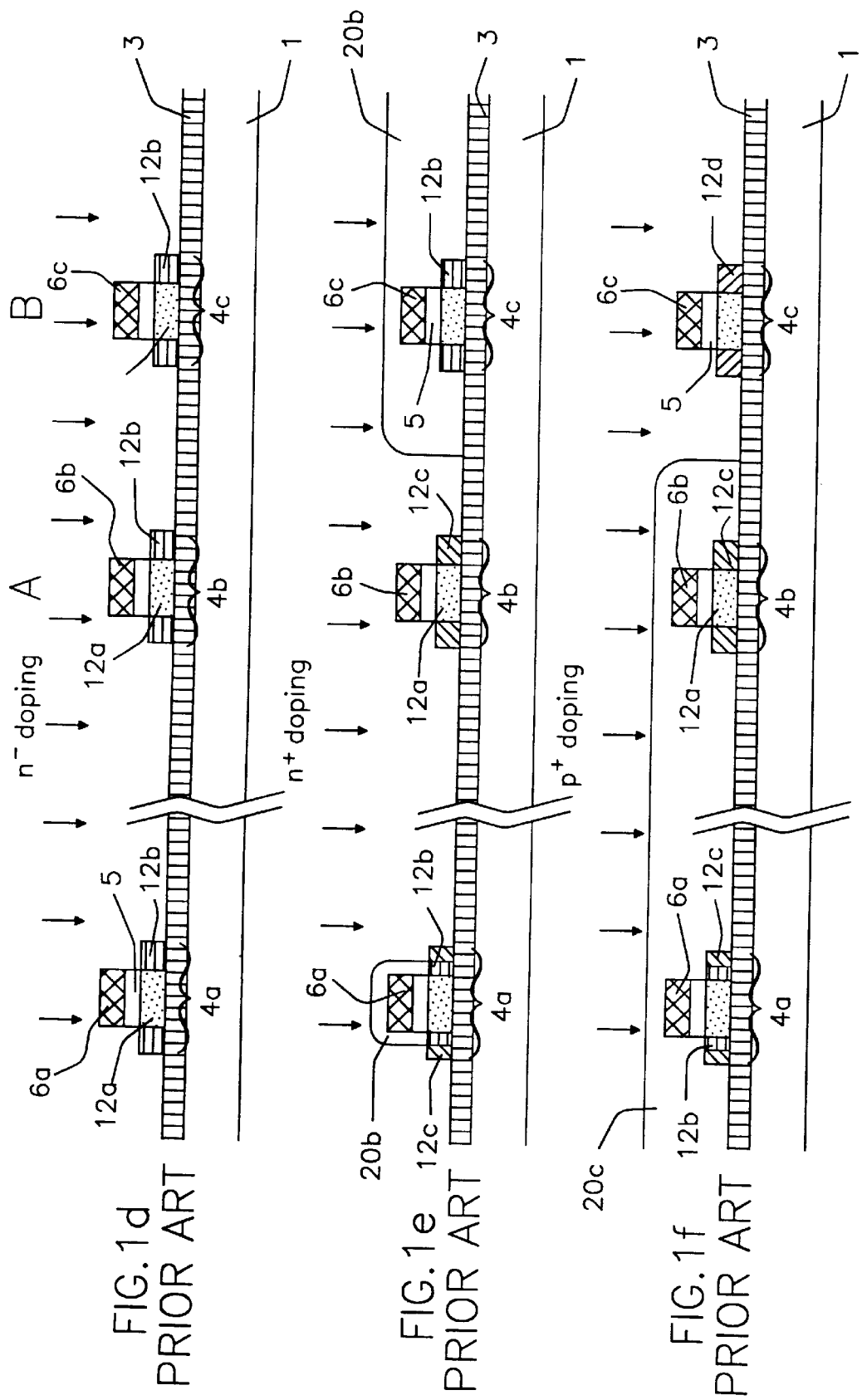
Figure 1G:
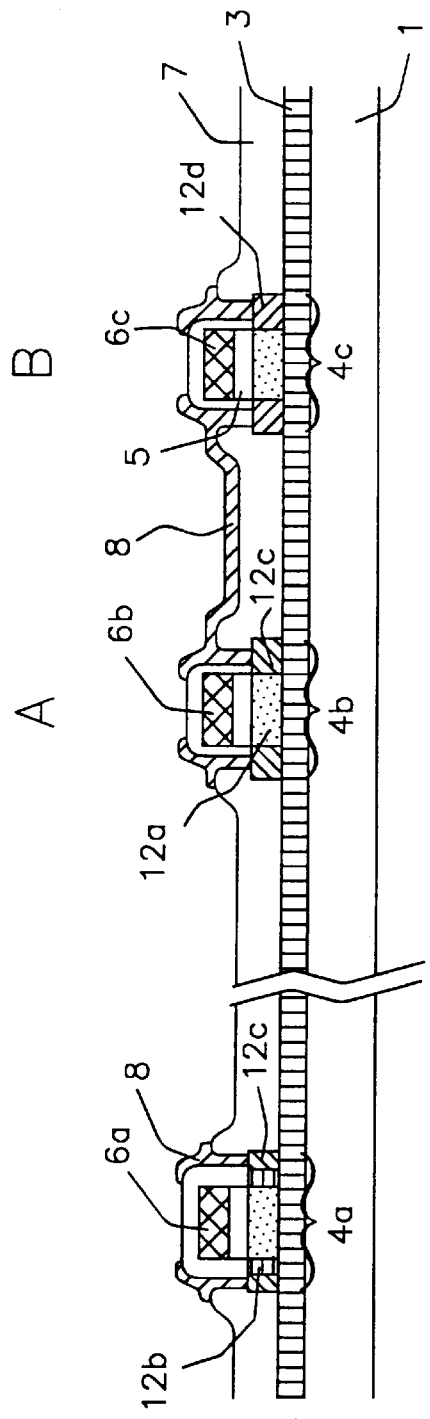
Figure 1H:
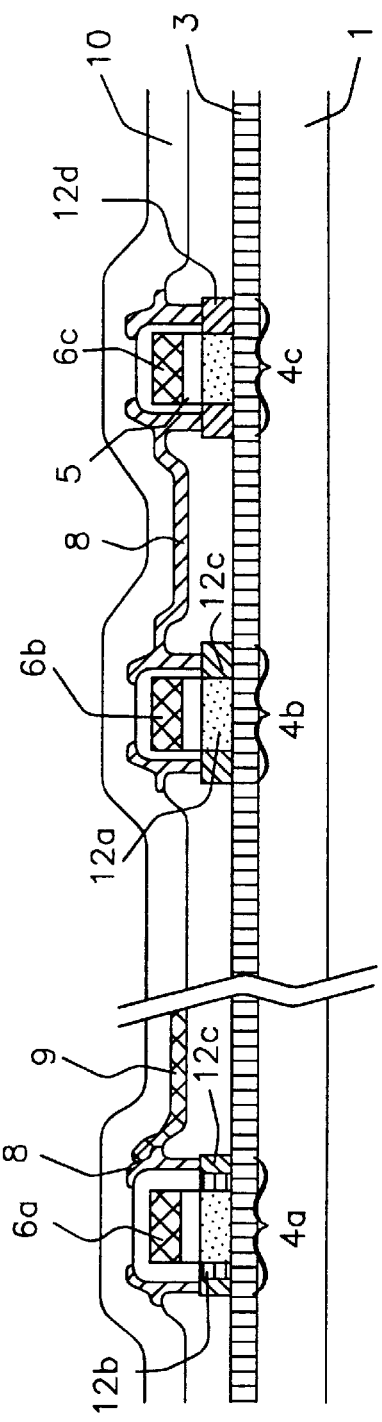

Semiconductor layer 104a, which will form part of a pixel driving TFT, is formed in the pixel region unit, and semiconductor layers 104b and 104c will form part of the CMOS TFTs of parts A and B of the driver circuit region. Typically, the p-Si layer can be formed at low temperatures (at below about 550° C.) and then patterned, as described above.

Photoresist 120a is next deposited on the buffer layer 103 and semiconductor layers 104a, 104b and 104c and then patterned through back exposure, as shown in FIG. 2d. Photoresist 120a is typically a negative photoresist. Thus, only portions of photoresist 120 shielded from the back exposure light by the black matrix 102 are removed during a subsequent development step. Accordingly, no additional masks are required to pattern photoresist 120a. Thus, black matrix 102 serves a dual purpose: preventing leakage of light through area outside the pixels, and patterning photoresist 120a. Further, since the black matrix 102 is not formed in part B of the driver circuit unit, semiconductor layer 104c is typically completely covered with photoresist 120, while only a central portion of semiconductor layer 104a of the pixel region and semiconductor layer 104b in part A of the driver circuit region are covered with the photoresist 120a.

As shown in FIG. 2e, an n⁺ implant is performed next. As a result, regions blocked by the photoresist 120a become the channel region 112a in semiconductor layer 104a and semiconductor layer 104b. Exposed semiconductor regions 112c, however, are heavily doped n⁺, while semiconductor layer 104c of part B of the driver circuit region is completely shielded by the photoresist 120a, and thus remains undoped at this stage of the process.

After photoresist 120a is removed, as shown in FIG. 2f, $SiO_2$ or SiNx is deposited over the entire substrate 101 and patterned to form gate insulating layer 105. A metal layer, such as Al, Al alloy, or Cr, is then deposited on the gate insulating layer 105 and patterned to form gate electrodes 106a, 106b and 106c and metal layer 106d. Portions of gate insulating layer 105 not covered by the metal patterns are removed. An n⁻ implant is next carried out using gate electrodes 106a, 106b, 106c and the metal layer 106d as a mask. This n⁻ implant causes little change in the n⁻ type impurity concentration of region 112c previously doped n⁺.

In semiconductor layer 104c of part B of the driver circuit unit, however, the n⁻ layer 112b preferably of the positive type is formed as a result of the n⁻ implant. Further, since the width of the gate electrode 106a of the pixel unit is narrower than that of the gate electrodes 106b and 106c, the n⁻ions are introduced into previously undoped portions of channel layer 112a, thereby forming an LDD structure 112b in the pixel region TFT.

Photoresist 120b is then blanketed over the entire substrate 101 and patterned to only shield the pixel region and part A of the diver circuit region. P⁺ ions are then implanted into the semiconductor layer 104c. As a result, n⁻ layer 112b in the semiconductor layer 104c is counter doped and converted into a p⁺ layer 112d, thereby forming PMOS TFT in addition to the NMOS TFT in region A. After the photoresist 120b is removed, as shown in FIG. 2i, an insulating layer 107, such as SiNx and SiOx, is formed over the entire surface of substrate 101 and patterned to form a contact hole. A transparent electrode 109, formed of ITO, for example, is deposited on the insulating layer 107 and into the contact hole, and patterned to form the pixel electrode and source/drain electrodes, as shown in FIG. 2j.

A liquid crystal panel, including pixel driving TFTs, CMOS TFTs for driving the pixel TFT and applying signals to the data and gate bus lines is thus are formed.

An alignment layer is then formed on the insulating layer 107 and the transparent layer 109. Since the alignment layer is formed directly on the insulating layer and not the passivation layer, no additional masks are required for providing the pad openings.

In the above mentioned process, six masks are required for patterning the black matrix, patterning the semiconductor layer, forming the gate electrode, the p⁺ implant mask, forming the contact hole, and forming the transparent electrode. Therefore, the number of the masks used for this process is decreased significantly relative to the conventional process described above.

In addition, the TFT for driving the pixel of the pixel unit and the CMOS TFT of the driver circuit are fabricated at the same time. Accordingly, the process is simplified, the yield is improved, and the fabrication cost is decreased. Further, since the black matrix is formed under the TFT for driving the pixel and the CMOS in one process step aperture ratio is improved.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. A method for fabricating a liquid crystal display comprising the steps of:
    forming a shielding layer on a substrate;
    forming a buffer layer on said substrate and said shielding layer, the substrate having a pixel region and a driver circuit region;
    forming a plurality of polycrystalline semiconductor layers on the buffer layer on the pixel region and the driver circuit region;
    forming first impurity regions in one of the plurality of semiconductor layers in the pixel region and in a first one of the plurality of semiconductor layers on the driver circuit region;
    forming a gate insulating layer on the substrate;
    forming a gate electrode and a gate bus line;
    forming a second impurity region in said one of the plurality of semiconductor layers in the pixel region;
    forming a third impurity region in a second one of the plurality of semiconductor layers on the driver circuit region;
    forming an insulating layer over said pixel and driver circuit regions, said insulating layer having a contact hole over a portion of the pixel region; and
    forming a transparent electrode over the pixel region and into the contact hole so as to form a source/drain electrode and a data bus line.

2. A method for fabricating a liquid crystal display in accordance with claim 1, wherein the first impurity layers, the second impurity layers, and the third impurity layers include $n^+$ regions, $n^-$ regions, and $p^+$ regions, respectively.

3. A method for fabricating a liquid crystal display in accordance with claim 2, wherein the step of forming the first impurity regions comprises the steps of:
    depositing and patterning a photoresist over the buffer layer to thereby shield a part of said one of said plurality of semiconductor layers in said pixel region, a part of said first one of said plurality semiconductor layers in said driver circuit region, and the second one of said plurality of semiconductor layers in said driver circuit region; and
    introducing $n^+$ ions into exposed portions of said one of the semiconductor layers in the pixel region and said first one of said semiconductor layers in said driver circuit region.

4. A method for fabricating a liquid crystal display in accordance with claim 3, wherein the photoresist includes a negative photoresist.

5. A method for fabricating a liquid crystal display in accordance with claim 4, wherein the photoresist is patterned using a back exposure process.

6. A method for fabricating a liquid crystal display in accordance with claim 2, wherein the step of forming the second impurity region includes the step of introducing n-type dopant at an $n^-$ concentration into the semiconductor layer using the gate electrode as a mask.

7. A method for fabricating a liquid crystal display in accordance with claim 2, wherein the step of forming the third impurity layer comprises;
    depositing and patterning a photoresist layer over the substrate to shield the pixel region and a portion of the driver circuit region; and
    introducing p-type impurities into the second one of said plurality of semiconductor layers in said driver circuit region.

8. A method for fabricating a liquid crystal display in accordance with claim 7, wherein the photoresist includes a positive photoresist.

9. A method for fabricating a liquid crystal display in accordance with claim 8, wherein the photoresist is patterned using a photo mask.

10. A method for fabricating a liquid crystal display in accordance with claim 1, wherein the step of forming the plurality of polycrystalline semiconductor layers further comprises the steps of:
    forming a plurality of amorphous semiconductor layers; and
    exposing the plurality of amorphous semiconductor layers with a laser beam.

11. A method for fabricating a liquid crystal display in accordance with claim 1, wherein said gate electrode is provided in said pixel region and a width of said gate electrode is narrower than said one of said plurality of semiconductor layers in said pixel region.

12. A method for fabricating a liquid crystal display in accordance with claim 1, wherein the transparent electrode includes indium tin oxide.

13. A method for fabricating a liquid crystal display in accordance with claim 1, wherein the shielding layer includes a black matrix.

14. A method of fabricating a liquid crystal display in accordance with claim 13, wherein the black matrix includes a black resin.

15. A method for fabricating a liquid crystal display comprising the steps of:
    forming a shielding layer on a substrate;
    forming a buffer layer over the substrate;
    forming a polycrystalline semiconductor layer on the buffer layer;
    forming a first impurity region and a channel region in said semiconductor layer;
    forming a gate insulating layer over the substrate;
    forming a gate electrode on the gate insulating layer, a width of the gate electrode being narrower than that of the channel region;
    forming a second impurity region between the first impurity layer and the channel layer;
    forming an insulating layer over the substrate said insulating layer having a contact hole; and
    forming a transparent electrode on the insulating layer and into the contact hole to thereby form a source/drain electrode.

16. A method for fabricating a liquid crystal display according to claim 15, wherein the first impurity region has an impurity concentration greater than an impurity concentration of said second impurity region.

17. A method for fabricating a liquid crystal according to claim 16, wherein the step of forming the first impurity region further comprises the steps of:

depositing and patterning a photoresist layer on the buffer layer so as to shield a portion of the semiconductor layer; and doping n$^+$ ions into exposed portion of said semiconductor layer.

18. A method for fabricating a liquid crystal display according to claim 17, wherein the photoresist layer includes a negative photoresist.

19. A method for fabricating a liquid crystal display according to claim 18, wherein said patterning step includes a back exposure process.

20. A method for fabricating a liquid crystal display according to claim 16, wherein the step of forming the second impurity layer includes the step of introducing n-type impurities at an n$^-$ concentration into the semiconductor layer using the gate electrode as a mask.

21. A method for fabricating a liquid crystal display according to claim 15, wherein the step of forming the plurality of polycrystalline semiconductor layers further comprises the steps of:

forming a plurality of amorphous semiconductor layers; and exposing the plurality of amorphous semiconductor layers to a laser beam.

22. A method for fabricating a liquid crystal display according to claim 15, wherein the transparent electrode includes indium tin oxide.

23. A method for fabricating a liquid crystal display according to claim 15, wherein the shielding layer includes a black matrix.

24. A method for fabricating a liquid crystal display according to claim 23, wherein the black matrix includes a black resin.

25. A method for fabricating a liquid crystal panel comprising the steps of:

forming a shielding layer on a substrate;

forming a buffer layer on the substrate;

forming a plurality of polycrystalline semiconductor layers on the buffer layer;

forming first impurity layers and channel layers in first ones of said plurality of semiconductor layers;

forming a gate insulating layer on the substrate;

forming a plurality of gate electrodes on the gate insulating layer, a width of the gate electrodes being substantially equal to a width of the channel layers;

forming a second impurity layer and a channel layer in a second one of said plurality of semiconductor layers;

forming an insulating layer on the substrate said insulating layer having a contact hole; and forming a transparent electrode on the insulating layer and into the contact hole so as to form source/drain electrodes.

26. A method for fabricating a liquid crystal panel according to claim 25, wherein the first impurity layers and the second impurity layer include n$^+$ regions and p$^+$ regions, respectively.

27. A method for fabricating a liquid crystal panel according to claim 26, wherein the step of forming the first impurity layers comprises the steps of:

depositing and patterning a photoresist over the buffer layer to thereby shield the second semiconductor layer; and introducing impurities at an n$^+$ concentration into the semiconductor layer.

28. A method for fabricating a liquid crystal panel according to claim 27, wherein the photoresist includes a negative photoresist.

29. A method for fabricating a liquid crystal panel according to claim 28, whereby the patterning step includes a back exposure process.

30. A method for fabricating a liquid crystal panel according to claim 26, wherein the step of forming the second impurity layer further comprises the step of:

depositing and patterning a photoresist layer over the substrate in order to shield the first semiconductor layers; and doping p$^+$ ions into the second semiconductor layer.

31. A method for fabricating a liquid crystal panel according to claim 30, wherein the photoresist includes a positive photoresist.

32. A method for fabricating a liquid crystal panel having a thin film transistor for driver circuit according to claim 31, the photoresist is patterned by a photo mask.

33. A method for fabricating a liquid crystal according to claim 25, wherein the step of forming the polycrystalline semiconductor layers further comprises the steps of:

forming a plurality of amorphous semiconductor layers; and exposing the plurality of amorphous semiconductor layers to a laser beam.

34. A method for fabricating a liquid crystal according to claim 25, wherein the transparent electrode includes indium tin oxide.

35. A method for fabricating a liquid crystal according to claim 25, wherein the shielding layer includes a black matrix.

36. A method for fabricating a liquid crystal panel according to claim 35 wherein the black matrix includes a black resin.

37. A method of fabricating a liquid crystal display device, comprising the steps of:

forming a patterned substantially opaque layer in a first surface of a transparent substrate;

forming a buffer layer over said opaque layer;

forming a photoresist layer over said buffer layer;

exposing said photoresist layer to a light source adjacent a second surface of said substrate opposite said first surface using said opaque layer as a mask; and selectively removing unexposed portions of said photoresist layer.

38. A method of fabricating a liquid crystal display device in accordance with claim 37, wherein said photoresist layer includes a negative photoresist.

* * * * *